Patent Number: 4,855,686
… Date of Patent: Aug. 8, 1989

[54] DIFFERENTIAL AMPLIFIER CIRCUIT

[75] Inventors: Ichiro Ishihara, Tokyo; Toshio Kanai, Yokohama, both of Japan

[73] Assignee: Kabushiki Kaisha Toshiba, Kawasaki, Japan

[21] Appl. No.: 201,220

[22] Filed: Jun. 2, 1988

[30] Foreign Application Priority Data

Jun. 3, 1987 [JP] Japan ............................... 62-138165

[51] Int. Cl.$^4$ .............................................. H03F 3/45
[52] U.S. Cl. ..................................... 330/261; 330/252
[58] Field of Search ............... 330/252, 253, 259, 260, 330/261, 149

[56] References Cited

U.S. PATENT DOCUMENTS 4,683,442  7/1987  Vyne .................................... 330/261

Primary Examiner—Gene Wan
Attorney, Agent, or Firm—Finnegan, Henderson, Farabow, Garrett & Dunner

[57] ABSTRACT

Disclosed is a differential amplifier circuit which includes a first NPN transistor, a second NPN transistor, a current source connected to the emitters of the first and second NPN transistors, a first PNP load transistor having a collector connected to the collector of the first NPN transistor, a second PNP load transistor having a collector coupled to the collector of the second NPN transistor, and an FET having a gate connected to the collector of the first NPN transistor, and a source connected to the bases of the first and second PNP load transistors. A DC input current of the FET is substantially zero, and is designed to absorb a current corresponding to the gate potential of the FET, from the bases of the first and second PNP load transistors.

11 Claims, 3 Drawing Sheets

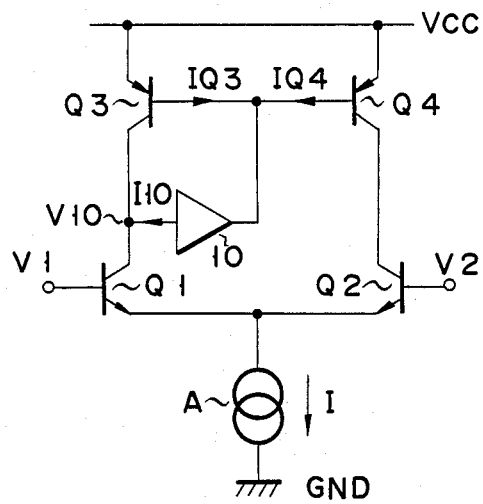
F I G. 1
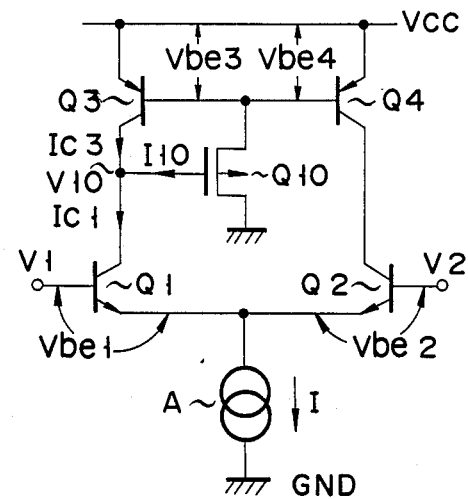
F I G. 2
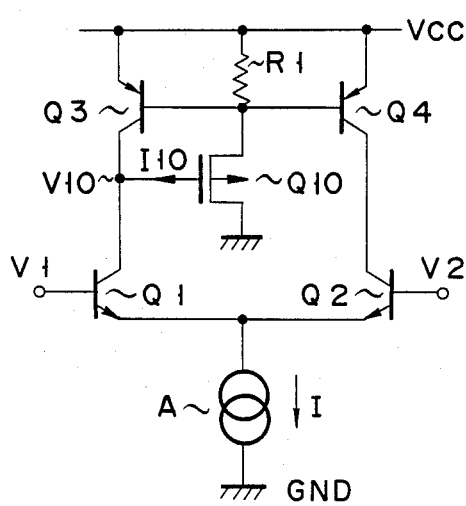
F I G. 3
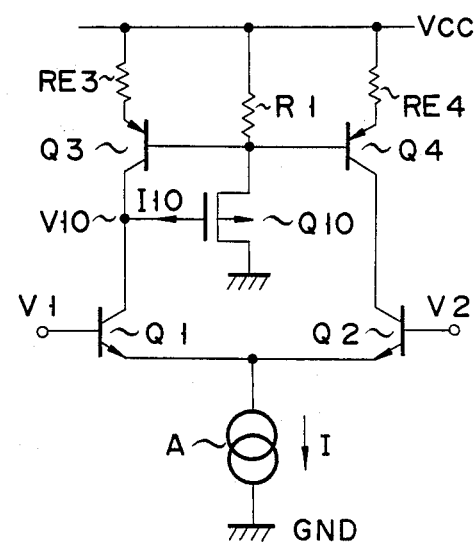
F I G. 4

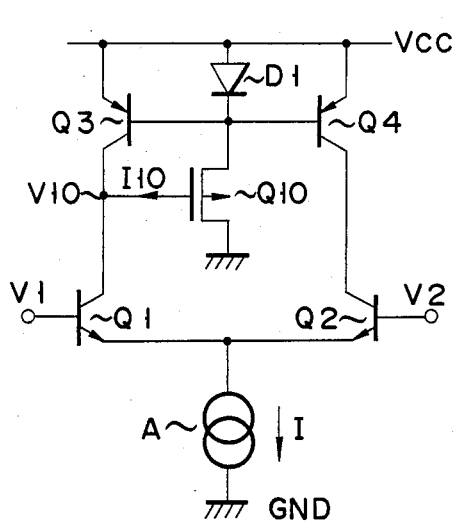
F I G. 5
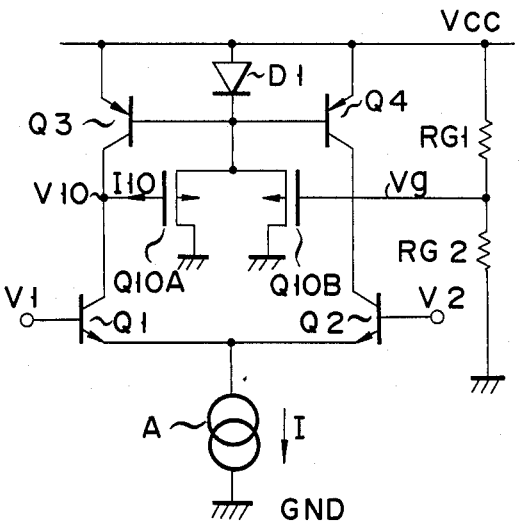
F I G. 6
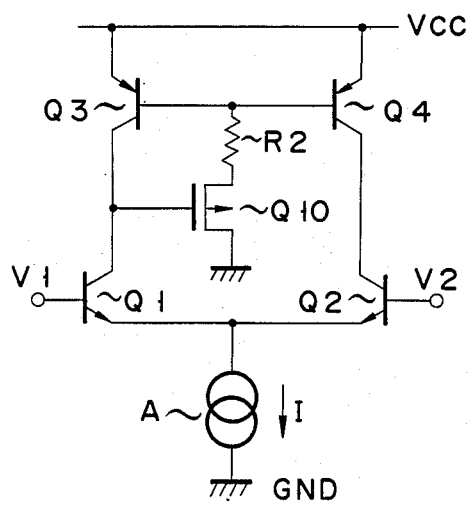
F I G. 7
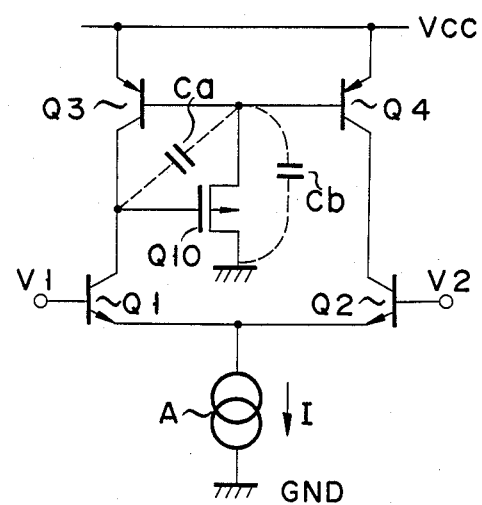
F I G. 8

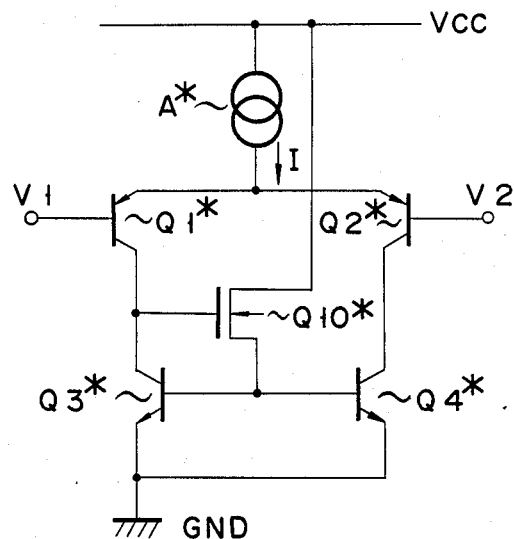
FIG. 9
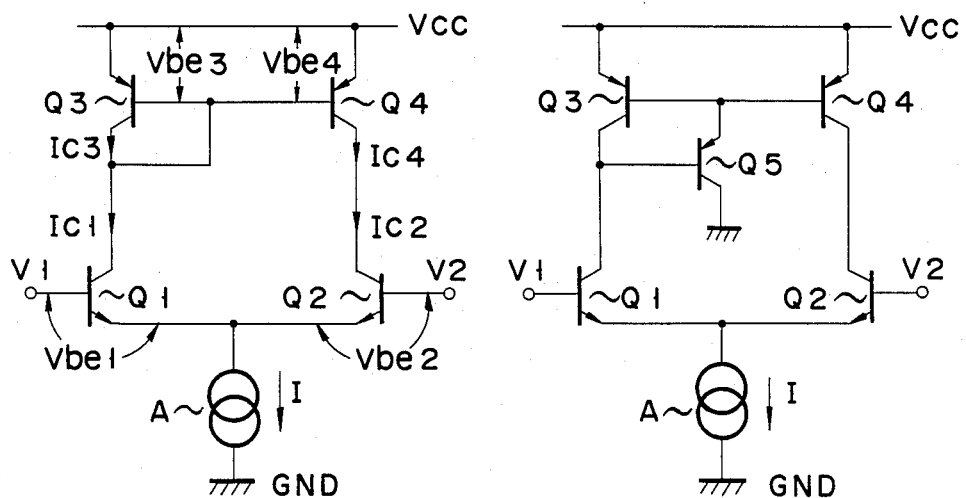
FIG. 10
(PRIOR ART)
FIG. 11
(PRIOR ART)

DIFFERENTIAL AMPLIFIER CIRCUIT

BACKGROUND OF THE INVENTION

1. Field of the Invention

The present invention relates to a differential amplifier circuit and, more particularly to, a differential amplifier circuit wherein the offset voltage is compensated for.

2. Description of the Related Art

FIG. 10 shows a conventional differential amplifier circuit comprising NPN transistors Q1 and Q2, current source A, and PNP transistors Q3 and Q4. Input signals V1 and V2 are supplied to the base of transistor Q1 and the base of transistor Q2, respectively. Current source A is connected between the common emitter of transistors Q1 and Q2 and the ground GND. PNP transistors Q3 and Q4 function as active loads of transistors Q1 and Q2, respectively. The offset voltage of this differential amplifier circuit will be discussed.

The bases of PNP transistors Q3 and Q4 are mutually connected, and the emitters of these transistors are coupled to power-supply Vcc terminal. Therefore, the base-emitter voltage Vbe3 of transistor Q3 is equal to the base-emitter voltage of transistor Q4. Hence:

$$(Ic3/Is3) = (Ic4/Is4)$$

where Ic3 is the collector current of transistor Q3, Ic4 is the collector current of transistor Q4, Is3 is the reverse saturation current of transistor Q3, and Is4 is the reverse saturation current of transistor Q4.

The collector current Ic2 of transistor Q2 is given:

$$Ic2 = Ic4 = Ic3(Is4/Is3)$$

The collector current Ic1 of transistor Q1 is given:

$$Ic1 = Ic3(1 + 2/\beta p)$$

where $\beta p$ is the current-amplification factor of PNP transistors Q3 and Q4.

Thus, the offset voltage Vos of the differential amplifier circuit shown in FIG. 10 is:

$$\begin{aligned}
Vos &= Vbe1 - Vbe2 \\
&= V_T ln(Ic1/Is1) - V_T ln(Ic2/Is2) \\
&= V_T ln\{(Ic1/Ic2) \times (Is2/Is1)\} \\
&= V_T ln[(Is3/Is4) \times (Is2/Is1) \times \{1 + (2/\beta p)\}]
\end{aligned}$$

Here, let us assume that:

$$\begin{aligned}
\Delta Isp &= Is3 - Is4, \\
Isp &= (Is3 + Is4)/2 \\
\Delta Isn &= Is1 - Is2 \\
Isn &= (Is1 + Is2)/2
\end{aligned}$$

Then, the offset voltage Vos can be represented as follows:

$$Vos = V_T ln\left[\left(\frac{2Isp + \Delta Isp}{2Isp - \Delta Isp}\right) \times \left(\frac{2Isn - \Delta Isn}{2Isn + \Delta Isn}\right) \times \right.$$

$$\left.\left(1 + \frac{2}{\beta p}\right)\right] =$$

$$V_T ln\left[\left(1 + \frac{2\Delta Isp}{2Isp - \Delta Isp}\right) \times \left(1 - \frac{2\Delta Isn}{2Isn + \Delta Isn}\right) \times \right.$$

$$\left.\left(1 + \frac{2}{\beta p}\right)\right]$$

Since $\Delta Isp << Isp$, and $\Delta Isn << Isn$, this equation reduces to:

$$Vso = V_T ln\left[\left(1 + \frac{\Delta Isp}{Isp}\right) \times \left(1 - \frac{\Delta Isn}{Isn}\right) \times \left(1 + \frac{2}{\beta p}\right)\right]$$

Here is the relationship:

$$ln(1+x) = x - (x^2/2) + (x^3/3) \ldots$$

And $\Delta Isp/Isp << 1$, $\Delta Isn/Isn << 1$, and $2/\beta p << 1$. Therefore, the second term et seq. of the above equation can be neglected. Hence:

$$Vso = V_T\left(\frac{\Delta Isp}{Isp} - \frac{\Delta Isn}{Isn} + \frac{2}{\beta p}\right) \quad (1)$$

The values of $\Delta Isp/Isp$ and $\Delta Isn/Isn$, both included in equation (1), are determined by the characteristics of the transistors used in the differential amplifier circuit. The third term in the right side, i.e., $2/\beta p$, is a factor which is determined by the structure of the circuit and the characteristics of the transistors used therein.

Assuming that $V_T = 26$ mV, $\Delta Isp/Isp = 5\%$, $\Delta Isn/Isn = 5\%$, and $\beta p = 10$, then the worst value for Vos will be:

$$Vos = 26 (0.05 + 0.05 + 0.1) = 7.8 \ mV$$

Hence that portion of the offset voltage which is determined by the their term in the right side of equation (1) is 2.6 mV ($= 26 \times 0.1$).

As has been pointed, the third term in the right side of equation (1) is determined by the structure of the circuit and the characteristics of the transistors used in this circuit. When PNP transistor Q5 is added to the circuit shown in FIG. 10, with its base coupled to the collector of transistor Q3 its emitter connected to the common base of transistors Q3 and Q4, and its collector connected to the ground, as is illustrated in FIG. 11, then, equation (1) changes to:

$$Vos = V_T\left[\frac{\Delta Isp}{Isp} - \frac{\Delta Isn}{Isn} + \frac{2}{\beta p(\beta p + 1)}\right]$$

When factors which are similar to those mentioned above, is applied, then:

$$Vos = 26 (0.05 + 0.05 + 0.0182) = 3.07 \ mV$$

In the circuit shown in FIG. 11, that portion of the offset voltage which is determined by the third term in the right side of equation (2) is 0.47 mV ($= 26 \times 0.0182$), far lower than the corresponding portion of the offset voltage of the differential amplifier circuit shown in FIG. 10. Nonetheless, the offset voltage (i.e., 2.6 mV) of the circuit is still too high.

SUMMARY OF THE INVENTION

It is accordingly the object of the present invention to provide a differential amplifier circuit whose offset voltage is low and whose operation characteristic is thus sufficiently prominent.

According to this invention, there is provided a differential amplifier circuit which comprises: first and second transistors of a first polarity, whose bases are connected to receive a first input signal and a second input signal, respectively, and whose emitters are connected to each other; a current source connected between common emitter of the first and second transistors and a first power-supply potential terminal; a third transistor of the second polarity whose collector is connected to the collector of the first transistor and whose emitter is connected to a second power-supply potential terminal; a fourth transistor of the second polarity whose collector of the second transistor, whose emitter is coupled to the second power-supply potential terminal, and whose base is connected to the base of the third transistor; and a field-effect transistor which is coupled, at one end, to the common base of the third and fourth transistors, and, at the other end, to the first power-supply potential terminal, and whose gate is connected to the node of the first and third transistors.

In this differential amplifier circuit, no current flows through the gate of the field-effect transistor. The collector current of the third transistor can be used as the collector current of the fourth transistor, thereby reducing the difference between the collector current of the third transistor and that of the fourth transistor. As a result, the offset voltage of the differential amplifier circuit can be lowered.

BRIEF DESCRIPTION OF THE DRAWINGS

FIG. 1 shows the basic structure of a differential amplifier circuit according to the present invention;

FIG. 2 shows another differential amplifier circuit according to the invention, wherein an FET (field-effect transistor, Q10) is connected between the base and collector of a transistor (Q3);

FIG. 3 shows a modification of the circuit shown in FIG. 2, wherein a resistor (R1) is connected between the common base of load transistors (Q3, Q4) and the common emitter of these transistors;

FIG. 4 illustrates a modification of the circuit shown in FIG. 3;

FIG. 5 shows another modification of the circuit shown in FIG. 2, wherein a diode (D1) is coupled between the common base of load transistors (Q3, Q4) and the common emitter of these transistors;

FIG. 6 illustrates a further modification of the circuit shown in FIG. 2, wherein a differential circuit comprised of FETs (Q10A, Q10B) is connected between the base and collector of a transistor (Q3);

FIG. 7 shows still another modification of the circuit shown in FIG. 2, wherein an FET (Q10) is coupled between the base and collector of a transistor (Q3), and a resistor (R2) is connected to the source of the FET for suppressing oscillation;

FIG. 8 is a diagram explaining how phase-compensation (i.e., the suppression of oscillation) is performed in the circuit shown in FIG. 2;

FIG. 9 shows another modification of the circuit shown in FIG. 2, wherein each transistor is of the polarity opposite to the corresponding one used in the circuit illustrated in FIG. 2; and FIGS. 10 and 11 show two conventional differential amplifier circuits.

DETAILED DESCRIPTION OF THE PREFERRED EMBODIMENTS

Embodiments of the present invention will now be described with reference to the accompanying drawings. In the drawings, the identical elements used in the embodiments are designated by the same symbol. The identical elements will not repeatedly described in the following description.

FIG. 1 shows the basic structure of a differential amplifier circuit according to the present invention. The circuit is different from the differential amplifier circuit shown in FIG. 11, in that a buffer amplifier 10, whose input current is substantially zero, is used in place of transistor Q5 (FIG. 11). In this circuit, the collector potential V10 of transistor Q3 is applied to the input terminal of buffer amplifier 10 whose DC input impedance is indefinitely high in effect, and the base currents IQ3 and IQ4 of both load transistors Q3 and Q4 are absorbed at the output terminal of buffer amplifier 10.

FIG. 2 illustrates another differential amplifier circuit according to this invention, wherein a field-effect transistor (FET) Q10 is used for buffer amplifier (FIG. 1). This circuit comprises NPN transistors Q1 and Q2 whose bases are connected to receive input signals V1 and V2, respectively, and whose emitters are mutually connected, current source A coupled between the common emitter of these transistors Q1 and Q2 and the ground terminal GND, and PNP transistors Q3 and Q4 functioning as the active loads of transistors Q1 and Q2, respectively. The circuit further comprises a P-channel FET Q10 which performs the same function as buffer amplifier 10 incorporated in the circuit shown in FIG. 1. FET Q10 and be either a MOS transistor or a junction transistor.

The source of FET Q10 is connected to the common base of transistors Q3 and Q4. The drain of FET Q10 is coupled to the ground terminal GND. The gate of FET Q10 is coupled to the node of the collectors of transistors Q3 and Q4.

No current I10 flows through the gate of FET Q10. Hence, the collector current Ic3 of transistor Q3 is identical to the collector current Ic1 of transistor Q1. The value of the third term in the right side of equation (1) is thus zero. The offset voltage of the differential amplifier circuit is, therefore, lower than that of the conventional differential amplifier circuit illustrated in FIG. 11, as will be understood from the following discussion.

In the circuit shown in FIG. 2, the bases of PNP transistors Q3 and Q4 are connected to each other, and the emitters of these transistors are coupled to power-supply Vcc terminal. Thus, the base-emitter voltage Vbe3 of transistor Q3 is equal to the base-emitter voltage Vbe4 of transistor Q4. Therefore:

$$(Ic3/Is3)=(Ic4/Is4)$$

where Ic3 is the collector current of transistor Q3, Ic4 is the collector current of transistor Q4, Is3 is the reverse saturation current of transistor Q3, and Is4 is the reverse saturation current of transistor Q4. The collector current Ic2 of transistor Q2 is given:

$$Ic2 = Ic4 = Ic3(Is4/Is3)$$

The collector current Ic1 of transistor Q1 is equal to the collector current Ic3 of transistor Q3. Namely:

$$Ic1 = Ic3$$

Hence, the offset voltage Vos of the differential amplifier circuit according to the present invention is:

$$\begin{aligned} Vos &= Vbe1 - Vbe2 \\ &= V_T ln(Ic1/Is1) - V_T ln(Ic2/Is2) \\ &= V_T ln\{(Ic1/Ic2) \times (Is2/Is1)\} \\ &= V_T ln\{(Is3/Is4) \times (Is2/Is1)\} \end{aligned}$$

Here, let us assume that:

$$\begin{aligned} \Delta Isp &= Is3 - Is4, \\ Isp &= (Is3 + Is4)/2 \\ \Delta Isn &= Is1 - Is2 \\ Isn &= (Is1 + Is2)/2 \end{aligned}$$

Then, the offset voltage Vos can be represented as follows:

$$Vos = V_T ln\left[\left(\frac{2Isp + \Delta Isp}{2Isp - \Delta Isp}\right) \times \left(\frac{2Isn - \Delta Isn}{2Isn + \Delta Isn}\right)\right] =$$

$$V_T ln\left(1 + \frac{2\Delta Isp}{2Isp - \Delta Isp}\right) \times \left(1 - \frac{2\Delta Isn}{2Isn + \Delta Isn}\right)$$

Here is the relationship of:

$$ln(1+x) = x - (x^2/2) + (x^3/3) \ldots$$

Further, $\Delta Isp/Isp \ll 1$, $\Delta Isn/Isn \ll 1$, and $2/\beta p \ll 1$. Thus, the second term et seq. of the above equation can be neglected. Therefore:

$$Vos = V_T\{(\Delta Isp/Isp) - (\Delta Isn/Isn) \ldots \quad (3)$$

In equation (3), $\Delta Isp/Isp$ and $\Delta Isn/Isn$ are factors which are determined by the characteristics of the transistors incorporated in the differential amplifier circuit.

Assuming that $V_T = 26$ mV, $\Delta Isp/Isp = 5\%$, $\Delta Isn/Isn = 5\%$, and $\beta p$, which is the current-amplification factor of transistors Q3 and Q4, is 10, then the value of Vos will be:

$$Vos = 26 (0.05 + 0.05) = 2.6 \, mV$$

Obviously, the offset voltage of the circuit shown in FIG. 2 lower than that (7.8 mV) of the conventional circuit shown in FIG. 10 and, also, than that (3.07 mV) of the conventional circuit illustrated in FIG. 11.

The gate potential V10 of FET Q10 is set at such a value that a voltage higher than the saturation voltage Vce(sat) is applied between the collector and emitter of transistor Q3. Potential V10 can be of this value by using an enhancement MOSFET or a depletion junction FET having a low gate bias or a small Idss, for field-effect transistor (FET) Q10.

FIG. 3 through FIG. 9 show other various embodiments of the present invention.

In the differential amplifier circuit shown in FIG. 3, resistor R1 is connected between the common base of active load transistors Q3 and Q4 and the common emitter of these transistors. This resistor R1 stabilize the base potentials of both load transistors Q3 and Q4.

The differential amplifier circuit shown in FIG. 4 is a modification of the circuit illustrated in FIG. 3. In this circuit, emitter resistors RE3 and RE4 are connected to transistors Q3 and Q4, respectively. Although the circuit is somewhat inferior to the circuit shown in FIG. 3 in respect of IC packing density, its DC stability is greater than that of the circuit shown in FIG. 3.

The circuit shown in FIG. 5 includes diode D1 coupled between the common base of transistors Q3 and Q4 and the common emitter of these transistors. This diode D1 has the same temperature coefficient as the base-emitter junction of either active load transistor. Diode D1, therefore, accomplishes the temperature compensation of the base currents of load transistors Q3 and Q4.

The circuit illustrated in FIG. 6 is different from the circuit shown in FIG. 5, in that a differential circuit comprised of FETs Q10A and Q10B is connected between the base and collector of transistor Q3 (FIG. 5). FET QIOA is equivalent to FET Q10 used in the circuits shown in FIGS. 2 to 5. The gate of FET Q10B, which forms a differential pair, along with FET Q10A, is applied with potential Vg obtained by dividing the power-supply voltage Vcc by means of registers RG1 and RG2. The operating point of transistors Q3 and Q4 can be adjusted by selecting an appropriate value for the gate potential Vg of FET Q10B. Diode D1, which is coupled between the common base of transistors Q3 and Q4 and the common emitter of these transistors can be replaced by resistor R1 (FIG. 4).

The circuit shown in FIG. 7 is identical to the circuit shown in FIG. 2, except that resistor R2 is coupled between the common base of transistor Q3 and Q4 and the source of FET Q10, for suppressing oscillation. Resistor R2 can be the diffusion resistance in the source electrode of FET Q10. This resistor can be dispensed with, when the conductance gm of FET Q10 is so small that there is no possibility of oscillation.

FIG. 8 explains how phase-compensation (i.e., the suppression of oscillation) is performed in the differential amplifier circuit shown in FIG. 2. Junction capacitance Cgs exists between the base and source (or between the gate and drain) of FET Q10. Also, junction capacitance Cob exists between the base and collector of transistor Q3. The sum of these junction capacitances, i.e., (Cob+Cgs), is designated by Ca in FIG. 8. In a high frequency region, capacitance Ca reduces the conductance gm of FET Q10 equivalently. Hence, the circuit can be prevented from oscillating if capacitance Ca is increased by increasing the overlapping area between, for example, the gate and source of FET Q10. If capacitance Ca is increased, thus preventing the circuit from oscillating, resistor R2 can be omitted.

Capacitance Cb exists between the source and drain of FET Q10. This capacitance can be increased sufficiently, thereby to prevent the circuit from oscillating.

FIG. 9 shows another differential amplifier circuit according to the present invention, which is identical to the circuit shown in FIG. 2, except that each transistor is of the polarity opposite to the corresponding one used in the circuit shown in FIG. 2. More precisely, the circuit shown in FIG. 9 comprises transistors Q1* to Q4* which differ, in polarity, from transistors Q1 to Q4 (FIG. 2), respectively, and N-channel FET Q10* equivalent to P-channel FET Q10 (FIG. 2). The drain of FET Q10* is connected to the power-supply Vcc terminal. The source of FET Q10* is connected the common base of transistor Q3* and Q4*, and the gate of FET Q10* is coupled to the node of transistors Q1* and Q3*. The circuit illustrated in FIG. 9 can have a sufficiently low offset voltage.

As has been described, the present invention can provide a differential amplifier circuit whose offset voltage is sufficiently low and which can, thus, operate with a great reliability.

What is claimed is:

1. A differential amplifier circuit comprising:
    differential amplifier means, including a pair of transistors of a first conductivity, for amplifying a difference between two input signals of the transistor pair;
    a first load transistor of a second conductivity having a collector connected to the collector of one transistor of said transistor pair;
    a second load transistor of the second conductivity type having a collector connected to the collector of the other transistor of said transistor pair; and
    circuit means, a DC input current of which is substantially zero, and having an input terminal connected to the collector of the one transistor, an output terminal connected to the bases of the first and second load transistors, for absorbing a current corresponding to the potential at said input terminal, from the bases of said first and second load transistors.

2. The differential amplifier circuit according to claim 1, further comprising a resistor connected between the bases of said first and second load transistors, on the one hand, and the emitters of said first and second load transistors, on the other hand.

3. The differential amplifier circuit according to claim 1, further comprising a diode connected between the bases of said first and second load transistors, on the one hand, and the emitters of said first and second load transistors, on the other hand.

4. The differential amplifier circuit according to claim 1, wherein said circuit means includes an FET having a gate connected to the collector of the first transistor, and a source or a drain connected to the bases of said first and second load transistors.

5. The differential amplifier circuit according to claim 4, wherein said FET has such a gate potential that a voltage higher than a saturation voltage of said first load transistor is applied between the collector and emitter of said first load transistor.

6. The differential amplifier circuit according to claim 1, wherein said circuit means includes means, coupled to the common bases of said first and second load transistors, for preventing the differential amplifier circuit from oscillating.

7. The differential amplifier circuit comprising:
    a first transistor of a first conductivity;
    a second transistor of a second conductivity type;
    a current source connected to the emitters of said first and second transistors;
    a first load transistor of the second conductivity type having a collector connected to the collector of said first transistor;
    a second load transistor of the second conductivity type having a collector connected to the collector of said second transistor; and
    an FET having a gate connected to the collector of said first transistor, and a source or a drain connected to the bases of said first and second load transistors, connected to receive a DC input current which is substantially zero, and designed to absorb a current corresponding to the gate potential of the FET, from the bases of said first and second load transistors.

8. The differential amplifier circuit according to claim 7, further comprising a resistor connected between the bases of said first and second load transistors, on the one hand, and the emitters of said first and second load transistors, on the other hand.

9. The differential amplifier circuit according to claim 7, further comprising a diode connected between the bases of said first and second load transistors, on the one hand, and the emitters of said first and second load transistors, on the other hand.

10. The differential amplifier circuit according to claim 7, wherein said FET has such a gate potential that a voltage higher than a saturation voltage of said first load transistor is applied between the collector and emitter of said first load transistor.

11. The differential amplifier circuit according to claim 7, further comprising a resistor, connected between the bases of said first and second load transistors, on the one hand, and the source of said FET, for preventing the differential amplifier circuit from oscillating.

* * * * *